(12) United States Patent
Taghivand et al.

(10) Patent No.: US 8,022,780 B2
(45) Date of Patent: Sep. 20, 2011

(54) AUXILIARY VARACTOR FOR TEMPERATURE COMPENSATION

(75) Inventors: Mazhareddin Taghivand, Campbell, CA (US); Conor Donovan, San Francisco, CA (US); Jeongsik Yang, Cupertino, CA (US); Sang-Oh Lee, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/107,592

(22) Filed: Apr. 22, 2008

(65) Prior Publication Data

US 2009/0261917 A1 Oct. 22, 2009

(51) Int. Cl.
*H03L 1/02* (2006.01)
(52) U.S. Cl. .................... 331/176; 331/177 V; 331/36 C
(58) Field of Classification Search .................. 331/176, 331/66, 177 V, 117 R, 167, 36 C
See application file for complete search history.

(56) References Cited

U.S. PATENT DOCUMENTS

| 4,978,930 | A | 12/1990 | Suter |
| 6,980,062 | B2 | 12/2005 | Fujita |
| 7,167,058 | B2 | 1/2007 | Meltzer |
| 7,227,423 | B2 * | 6/2007 | McCorquodale et al. ..... 331/179 |
| 7,696,826 | B2 * | 4/2010 | Ripley et al. .................. 330/289 |
| 2007/0085620 | A1 * | 4/2007 | Ohkubo et al. ........... 331/177 V |
| 2008/0164955 | A1 * | 7/2008 | Pfeiffer et al. ............ 331/117 R |

FOREIGN PATENT DOCUMENTS

EP 0933875 A1 8/1999
WO WO2005101664 10/2005

OTHER PUBLICATIONS

International Search Report and Written Opinion—PCT/US2009/041467, International Search Authority—European Patent Office—Oct. 7, 2009.

* cited by examiner

*Primary Examiner* — Joseph Chang
(74) *Attorney, Agent, or Firm* — Larry Moskowitz

(57) ABSTRACT

Techniques for compensating for the effects of temperature change on voltage controlled oscillator (VCO) frequency are disclosed. In an embodiment, an auxiliary varactor is coupled to an LC tank of the VCO. The auxiliary varactor has a capacitance controlled by a temperature-dependant control voltage to minimize the overall change in VCO frequency with temperature. Techniques for generating the control voltage using digital and analog means are further disclosed.

26 Claims, 7 Drawing Sheets

AUXILIARY VARACTOR FOR TEMPERATURE COMPENSATION

TECHNICAL FIELD

The disclosure relates to voltage-controlled oscillators (VCO's), and more particularly, to techniques for addressing frequency shift of VCO's due to temperature change.

BACKGROUND

A voltage-controlled oscillator (VCO) is an electrical oscillator designed to generate a signal having an oscillation frequency controlled by a voltage input. A VCO may be implemented using a varactor (i.e., a voltage variable capacitor) in an LC tank resonator coupled to an oscillator circuit. By varying the capacitance of the varactor using a control voltage, the oscillation frequency of the VCO can be controlled.

During normal operation, temperature changes in the VCO circuit may lead to unwanted deviations of the oscillation frequency from the expected frequency. It would be desirable to have techniques to compensate for deviations in the VCO oscillation frequency caused by temperature change.

SUMMARY

An aspect of the present disclosure provides a method for adjusting the oscillation frequency of a voltage-controlled oscillator (VCO), a temperature change in the VCO causing a variation in the VCO oscillation frequency, the method comprising sensing a temperature of the VCO; coupling an auxiliary varactor to the VCO, a change in the capacitance of the auxiliary varactor causing a change in the oscillation frequency of the VCO; controlling the capacitance of the auxiliary varactor using a control voltage; and adjusting the control voltage based on the sensed temperature such that the variation in the VCO oscillation frequency due to VCO temperature change is reduced.

DETAILED DESCRIPTION

Figure 1:
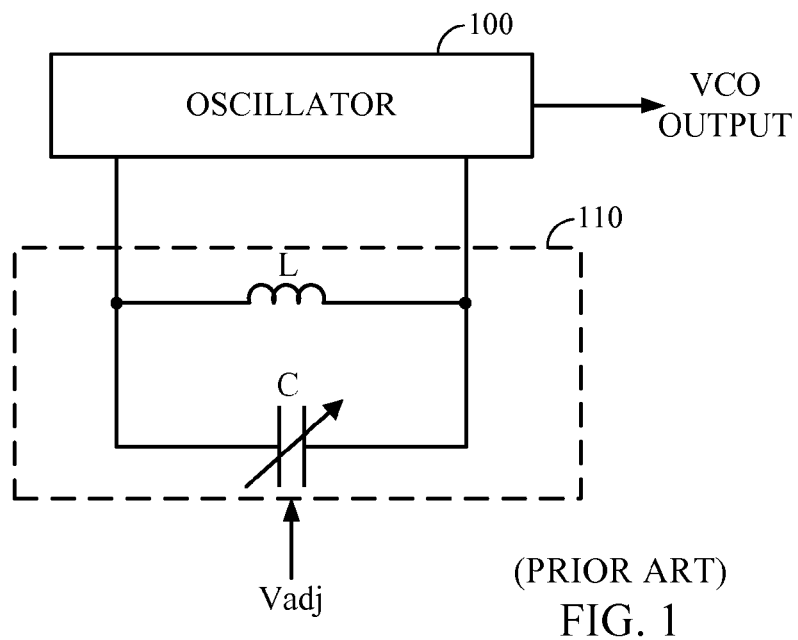
FIG. 1 depicts a prior art VCO design employing an oscillator circuit 100 coupled to an LC tank.

FIG. 1 depicts a prior art VCO design employing an oscillator circuit 100 coupled to an LC tank 110. A control voltage Vadj controls the capacitance of varactor C in the LC tank. This controls the LC tank resonant frequency and, hence, the VCO oscillation frequency. The varactor C may comprise a plurality of constituent capacitors, some or all of whose capacitances may be controlled by one or more control signals Vadj.

For example, in an embodiment of an analog VCO, the oscillating frequency may be coarsely tuned by selectively switching on and off a bank of capacitors based on a set of digital control voltages. The frequency may then be finely tuned by controlling the capacitance of a varactor using an analog voltage. In this embodiment, the signal Vadj may comprise a plurality of digital signals to control the coarse tuning, and an analog signal to control the fine tuning. Alternatively, in an embodiment of a digital VCO, or a DCO (digitally controlled oscillator), both coarse tuning and fine tuning of the operating capacitance may be controlled using digital signals. Note in this specification and in the claims, the term voltage-controlled oscillator (VCO) will be understood to encompass both analog VCO's and digital VCO's (DCO's). One of ordinary skill in the art will realize that the techniques disclosed herein may readily be applied to both digital and analog VCO's.

Figure 1A:
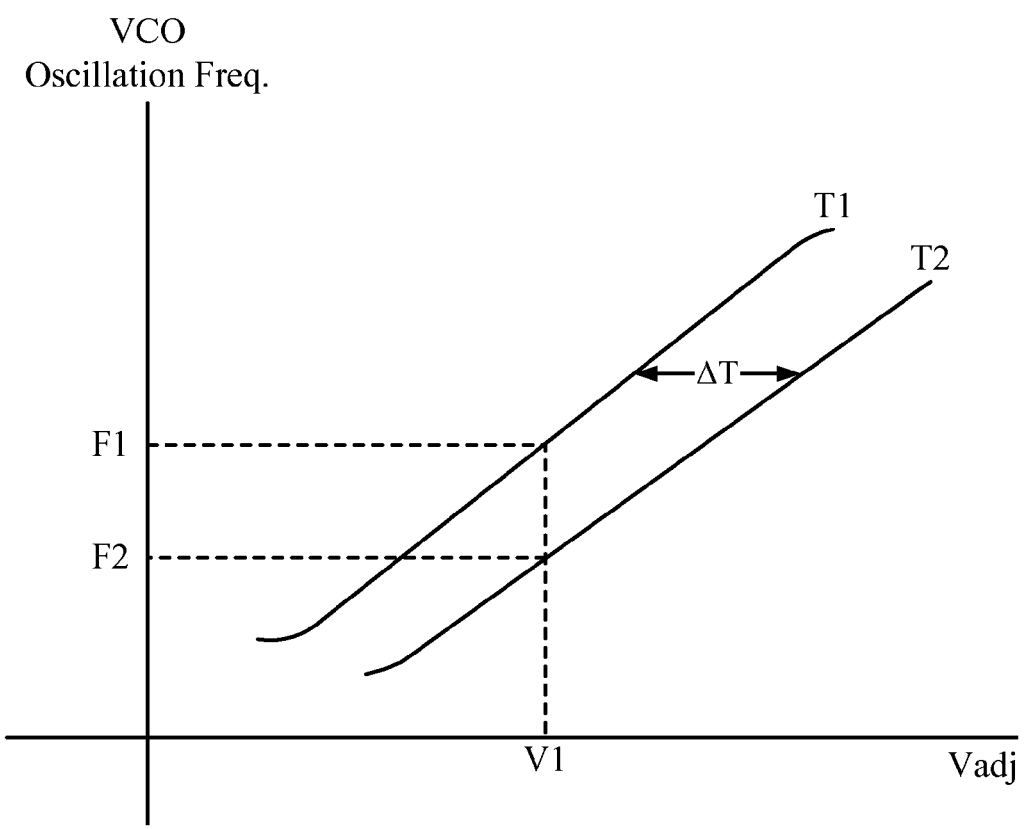
FIG. 1A depicts an example relationship between the control voltage Vadj and the VCO oscillation frequency.

FIG. 1A depicts an example relationship between the control voltage Vadj and the VCO oscillation frequency. For a given control voltage Vadj=V1 and VCO temperature T1, the VCO oscillation frequency is shown to be F1. Further depicted is that a change ΔT in VCO temperature from T1 to T2 causes the VCO oscillation frequency to shift from F1 to F2. The shift in frequency may be caused by temperature-dependent changes in the varactor, the oscillator circuit, or any other mechanism, and is generally undesirable for VCO operation.

Note that the relationship between Vadj and frequency in FIG. 1A is shown for illustrative purposes only. One of ordinary skill in the art will realize that the techniques of the present disclosure may be applied to an arbitrary functional mapping between Vadj and VCO frequency. Furthermore, VCO frequency change may be directly related to temperature change, inversely related, or have any arbitrary relationship different from that shown in FIG. 1A. For ease of illustration, the present disclosure may refer to an embodiment wherein the VCO oscillation frequency change is inversely proportional to temperature change. One of ordinary skill in the art will realize, however, that the techniques of the present disclosure may readily be applied to embodiments wherein VCO oscillation frequency has a different relationship with temperature than explicitly described herein.

FIG. 2 depicts an embodiment according to the present disclosure, wherein an auxiliary varactor Caux is provided to counter the effects of temperature change on the VCO frequency. In FIG. 2, an auxiliary varactor Caux is coupled in parallel with the main capacitance C in the LC tank of VCO 100.

Figure 2A:
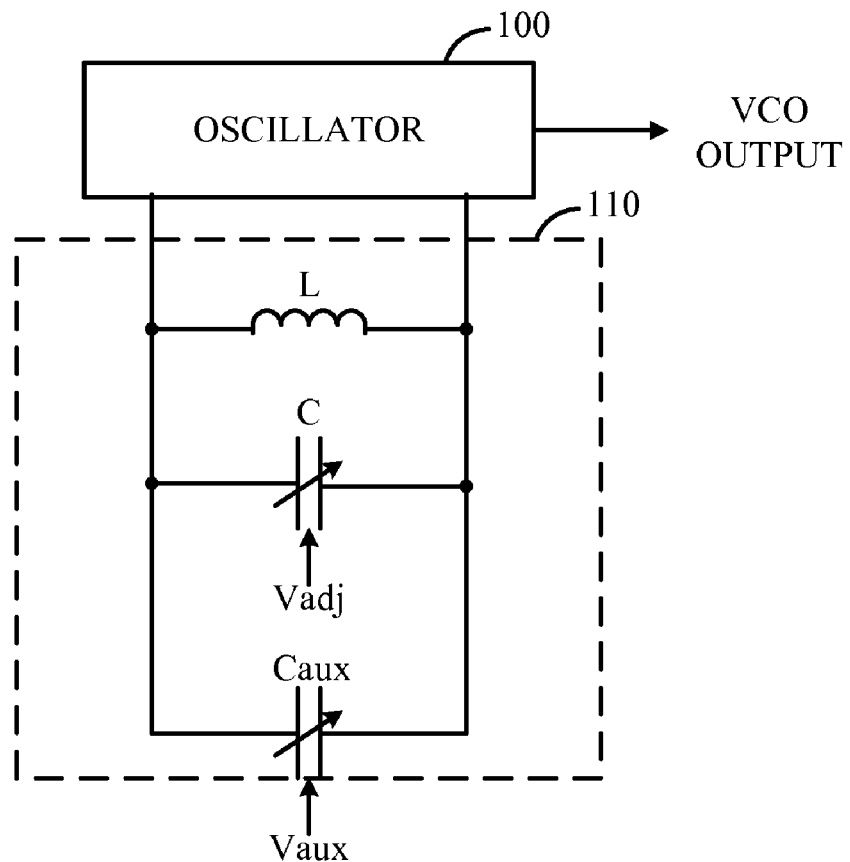
FIGS. 2A and 2B depict embodiments according to the present disclosure, wherein an auxiliary varactor Caux is provided to counter the effects of temperature change in the VCO.

In FIG. 2A, the capacitance of Caux is controlled by a compensating control voltage Vaux. In an embodiment, Vaux is designed to vary over temperature so that the capacitance of Caux changes to compensate for temperature-dependent VCO frequency changes. In the embodiment of FIG. 2A, if VCO oscillation frequency is inversely related to temperature, then it would be desirable to increase the capacitance of Caux when temperature decreases, and conversely, to decrease the capacitance of Caux when temperature increases. As shown in FIG. 2A, the auxiliary varactor Caux may be coupled in parallel with the main varactor C, or in any way that allows the overall capacitance of the LC tank to be affected by the auxiliary varactor.

Figure 2B:
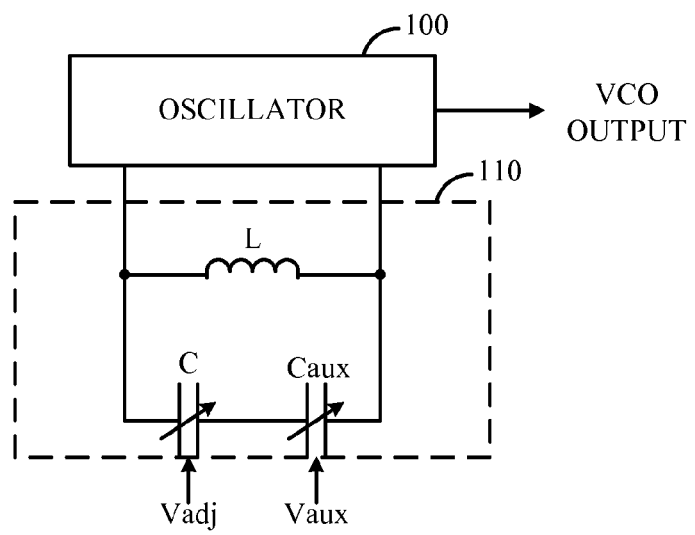

One of ordinary skill in the art will realize that in an alternative embodiment shown, for example, in FIG. 2B, the auxiliary varactor Caux may be coupled in series with the main varactor C, or in any way that allows the overall capacitance of the LC tank to be affected by the auxiliary varactor. In such embodiments, the relationship between Caux and T may be modified accordingly. These embodiments are contemplated to be within the scope of the present disclosure.

Figure 3A:
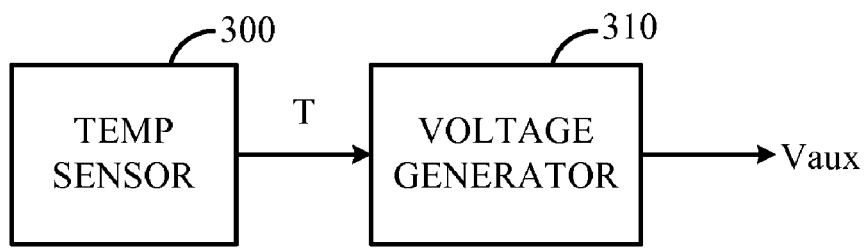
FIGS. 3A and 3B depict generalized embodiments according to the present disclosure for generating a signal Vaux to control the auxiliary varactor Caux.
Figure 3B:
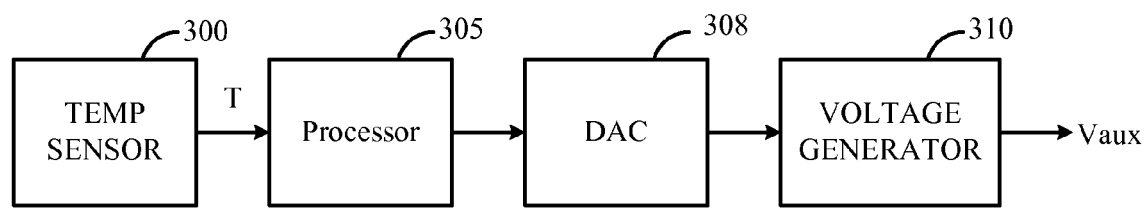

FIGS. 3A and 3B depict generalized embodiments according to the present disclosure for generating a signal Vaux to control the auxiliary varactor Caux. In FIG. 3A, a temperature sensor 300 indicates the measured temperature T of the VCO. Voltage generator 310 generates the voltage Vaux based on T. The functional relationship between voltage Vaux and T may be determined by the expected dependence of VCO oscillation frequency on temperature. Such expected dependence may be derived, e.g., using computer circuit simulation, data from lab measurement, or any other mechanism known to one of ordinary skill in the art. In an embodiment, the functional relationship between Vaux and T may be chosen to allow the capacitance of varactor Caux to compensate for the expected dependence of VCO oscillation frequency on temperature. In FIG. 3B, a temperature sensor 300 indicates the measured temperature T of the VCO. A processor 305 may be used to convert the sensed temperature signal to a digital control signal. The converted digital control signal may be input into a digital-to-analog converter (DAC) 308 to generate an output signal corresponding to the digital control signal. Voltage generator 310 generates the voltage Vaux based on the output signal from the DAC 308. As disclosed above, the functional relationship between voltage Vaux and T may be determined by the expected dependence of VCO oscillation frequency on temperature. Such expected dependence may be derived, e.g., using a computer circuit simulation, data from lab measurements, or any other mechanism known to one of ordinary skill in the art. In an embodiment, the functional relationship between Vaux and T may be chosen to allow the capacitance of varactor Caux to compensate for the expected dependence of VCO oscillation frequency on temperature.

In an embodiment, the relationship between Vaux and temperature T may be designed according to the following guidelines (Guidelines 1):

$$\text{If } \left(\frac{\Delta F(T)}{\Delta T}\right)\left(\frac{\Delta C_{aux}(V_{aux})}{\Delta V_{aux}}\right) > 0, \text{ then } \frac{\Delta V_{aux}(T)}{\Delta T} > 0, \text{ and}$$

$$\text{If } \left(\frac{\Delta F(T)}{\Delta T}\right)\left(\frac{\Delta C_{aux}(V_{aux})}{\Delta V_{aux}}\right) < 0, \text{ then } \frac{\Delta V_{aux}(T)}{\Delta T} < 0;$$

wherein $$\left(\frac{\Delta F(T)}{\Delta T}\right)$$

is the expected change in oscillator frequency due to temperature divided by the corresponding temperature change, $$\left(\frac{\Delta C_{aux}(V_{aux})}{\Delta V_{aux}}\right)$$

is the expected change in auxiliary capacitance due to Vaux divided by the corresponding change in Vaux, and $$\frac{\Delta V_{aux}(T)}{\Delta T}$$

is the desired relationship between change in Vaux and change in temperature T. Note the relationships in Guidelines 1 are given for illustrative purposes only, and are not meant to limit the scope of the present disclosure to any particular relationship between Vaux and T.

One of ordinary skill in the art will realize that the measured temperature T may be an analog or digital signal. The voltage generator 310 may be implemented directly using analog circuitry to synthesize the desired functional relationship, or it may be implemented digitally using, e.g., a look-up table (LUT) or other digital means. In an embodiment, the voltage generator 310 may receive an analog representation of T, digitize it using an analog-to-digital converter (ADC), implement the desired relationship in the digital domain, and convert the digitally generated signal back to the analog domain as Vaux. In an alternative embodiment, the voltage generator 310 may supply Vaux as one or more digital control signals, and Caux may be implemented as a set of switchable capacitors controlled by Vaux.

Figure 4:
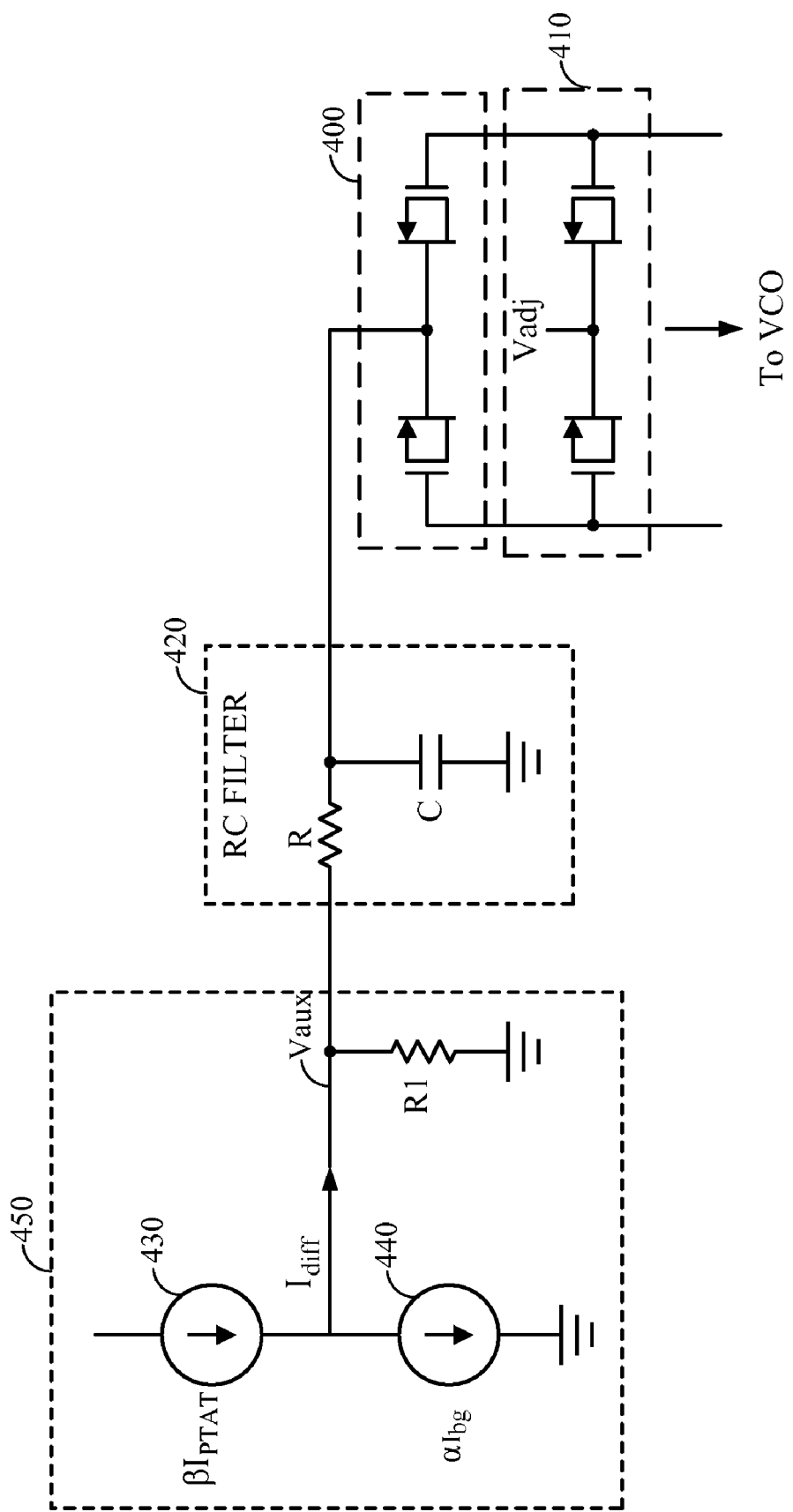
FIG. 4 depicts an embodiment of circuitry for generating the voltage Vaux directly in the analog domain according to a function that varies proportionally with temperature.

FIG. 4 depicts an embodiment of circuitry for generating the voltage Vaux directly in the analog domain according to a function that varies proportionally with temperature. Also depicted in FIG. 4 is a specific embodiment of the auxiliary varactor Caux 400 in an LC tank of a VCO.

In FIG. 4, a varactor Caux 400 is controlled by control voltage Vaux. In the embodiment shown, the varactor Caux 400 is implemented as an NMOS varactor, wherein the varactor control voltage is inversely related to the varactor capacitance. Varactor Caux 400 is coupled in parallel with a main varactor C 410 controlled by the VCO control voltage Vadj. The parallel varactors are coupled to the VCO. In an embodiment, an additional set of digitally controlled capacitors (not shown) may also be provided for coarse tuning.

In FIG. 4, control voltage Vaux is generated by temperature sensor/voltage generator 450, and coupled to varactor Caux by RC filter 420. In the embodiment shown, the RC filter 420 is provided to remove high-frequency noise from Vaux before coupling to Caux. Voltage generator 450 includes a first current source 430 and a second current source 440. In an embodiment, the magnitude of the current generated by the first current source 430 is designed to be dependent on the temperature T, while the magnitude of the current generated by the second current source 440 is designed to be independent of temperature. In an embodiment, the second current source 440 may be a bandgap current source well-known in the art. The current sources are coupled so that the difference in the currents generated by 430 and 440 flows as current $I_{diff}$.

In an embodiment, the first current source can be designed to generate a current having magnitude directly proportional to absolute temperature, or PTAT (Equation 1):

$$\beta I_{ptat}(T) = \alpha I_{bg}(1 + T_C(T - T_0));$$

wherein $I_{ptat}(T)$ is the magnitude of the base current generated by first current source 430, $I_{bg}$ is the (temperature-independent) magnitude of the base current generated by bandgap current source 440, the coefficients $\alpha$ and $\beta$ are current multipliers selectable by an externally supplied control signal, T is the temperature in Celsius, $T_C$ is the temperature coefficient of the first current source 430, and $T_0$ is a reference temperature fixed by the design of the current source. In an embodiment, $T_0$ may be 25 degrees Celsius.

The current $I_{diff}$ may be expressed as follows (Equations 2):

$$I_{diff} = \beta I_{ptat} - \alpha I_{bg}$$
$$= \beta I_{bg}(1 + T_C(T - T_0)) - \alpha I_{bg}$$
$$= (\beta - \alpha)I_{bg}\left[1 + \frac{\beta}{\beta - \alpha}T_C(T - T_0)\right];$$

wherein the term $$\frac{\beta}{\beta - \alpha}$$

acts to modify the slope of $I_{diff}$'s dependence on temperature T.

In an embodiment, the current multipliers $\alpha$ and $\beta$ may be implemented by selectively activating a plurality of parallel-coupled current sources. In an embodiment, the values of $\beta$ and $\alpha$ may be programmed to modify the temperature coefficient $T_C$ of $I_{diff}$ (i.e., the first-order dependence of $I_{diff}$ on temperature T) as follows (Table 1):

| Programmable code | Effective $T_C$ |
|---|---|
| $\alpha = 1, \beta = 3$ | 1.5 $T_C$ |
| $\alpha = 2, \beta = 4$ | 2 $T_C$ |
| $\alpha = 3, \beta = 5$ | 2.5 $T_C$ |
| $\alpha = 4, \beta = 6$ | 3 $T_C$ |

In FIG. 4, a constant resistance R1 is provided to convert the temperature-dependent $I_{diff}$ into the voltage Vaux, i.e., Vaux $=I_{diff}*R1$. In an embodiment, the resistance R1 may be implemented as a poly resistor, a metal resistor, a diffusion resistor, or any other type of resistor known to one of ordinary skill in the art. In an alternative embodiment (not shown), the slope of Vaux versus temperature may also be controlled by selecting R1 from one of several values. Note in an embodiment wherein only the sign of $$\frac{\Delta V_{aux}(T)}{\Delta T}$$

according to Guidelines 1 is controlled, the resistance R1 need not meet strict accuracy tolerances.

Note the embodiment of FIG. 4 is shown for illustrative purposes only, and is not meant to limit the scope of the present disclosure to any particular method of generating Vaux, nor to any particular implementation of varactor Caux. In alternative embodiments, the auxiliary varactor could be connected across the tank by any means, for example, using AC coupling capacitors.

Note a VCO employing the techniques described above may be incorporated into, e.g., a phase-locked loop (PLL), to assist the PLL in locking onto a desired frequency in the presence of temperature variations.

Figure 5A:
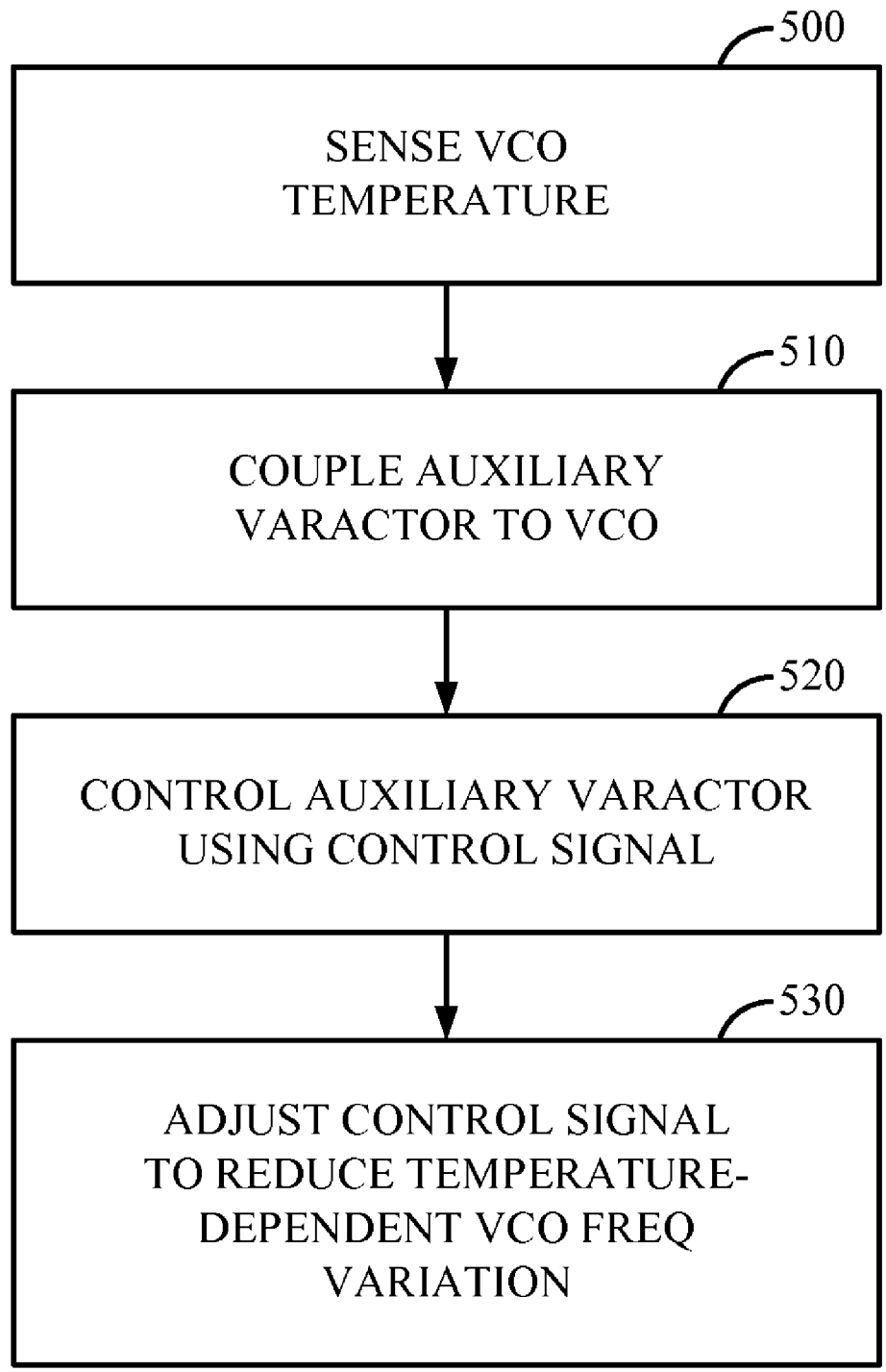
FIGS. 5A and 5B depict embodiment methods according to the present disclosure.
Figure 5B:
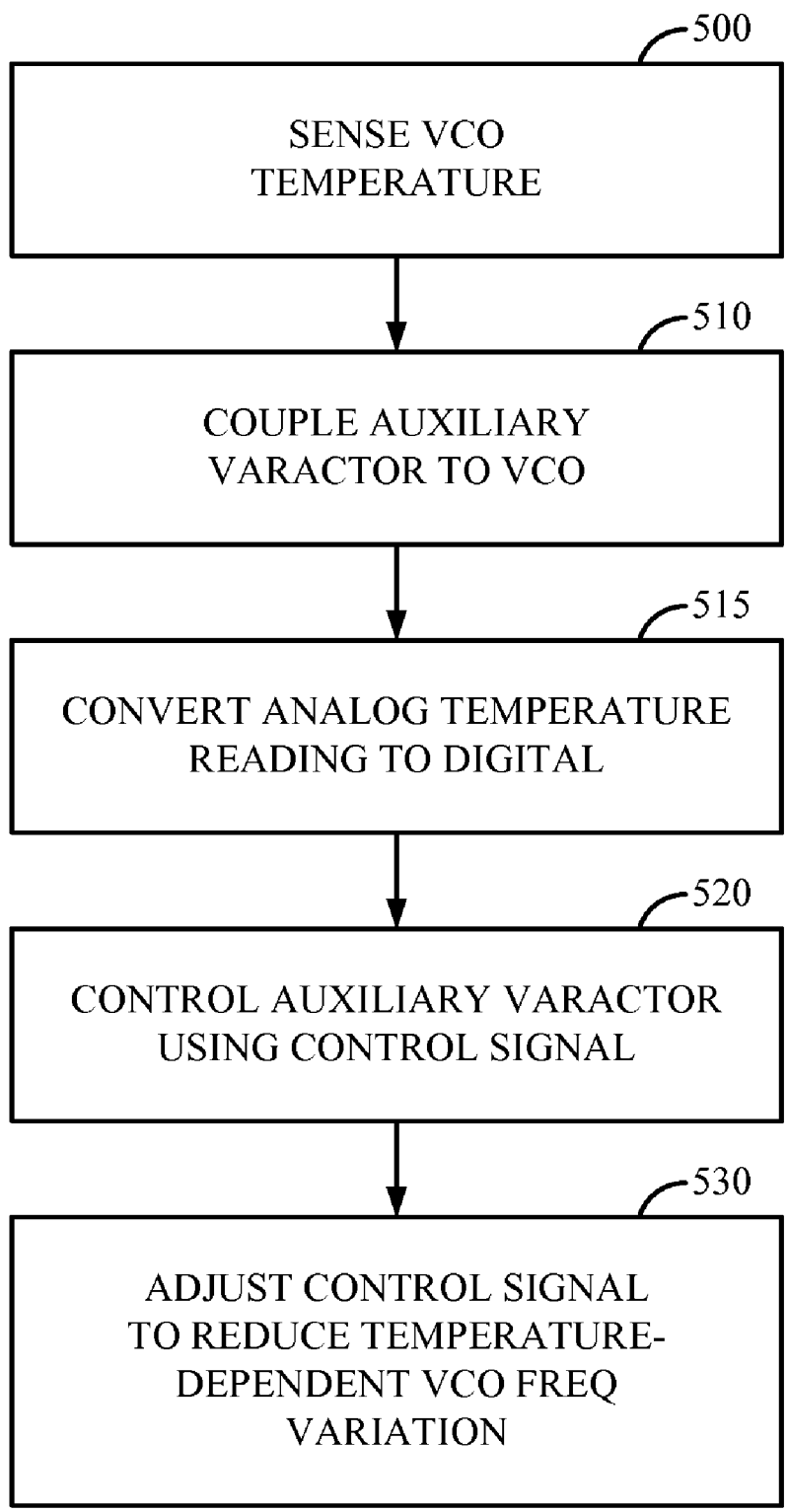

FIGS. 5A and 5B depict embodiment methods according to the present disclosure. In FIG. 5A, at step 500, the VCO temperature is sensed by, e.g., a temperature sensor, or other temperature-dependent circuitry according to the present disclosure. At step 510, an auxiliary varactor is coupled to the VCO, such that the frequency of the VCO may be adjusted by the adjusting the capacitance of the auxiliary varactor. At step 520, the capacitance of the auxiliary varactor is controlled using a control signal. At step 530, the control signal is adjusted in a manner so as to reduce the temperature-dependent variation in the VCO oscillation frequency. In an embodiment, the control signal may be generated as previously described herein with reference to FIG. 4. In alternative embodiments, the control signal may be generated using any manner derivable by one of ordinary skill in the art so as to reduce the temperature-dependent variation in the VCO oscillation frequency. Such embodiments are contemplated to be within the scope of the present disclosure. For example, similar to the process flow depicted in FIG. 5A, in FIG. 5B, the VCO temperature may be sensed by, e.g., a temperature sensor, or other temperature-dependent circuitry according to the present disclosure, step 500. The auxiliary varactor may be coupled to the VCO, such that the frequency of the VCO may be adjusted by the adjusting the capacitance of the auxiliary varactor, step 510. The sensed temperature signal may be converted from an analog signal to a digital signal through a processor 308 or an analog-to-digital convertor (not shown). Once the digital signal corresponding to the sensed temperature is generated, a control signal value may be determined from a look-up table which contains control signal values correlated to various sensed temperature values, step 318. The determined control signal value may be converted back to an analog signal (e.g., via DAC 308) and used to control the capacitance of auxiliary varactor, step 520. In a similar manner, the control signal is adjusted in a manner so as to reduce the temperature-dependent variation in the VCO oscillation frequency, step 530.

Figure 6:
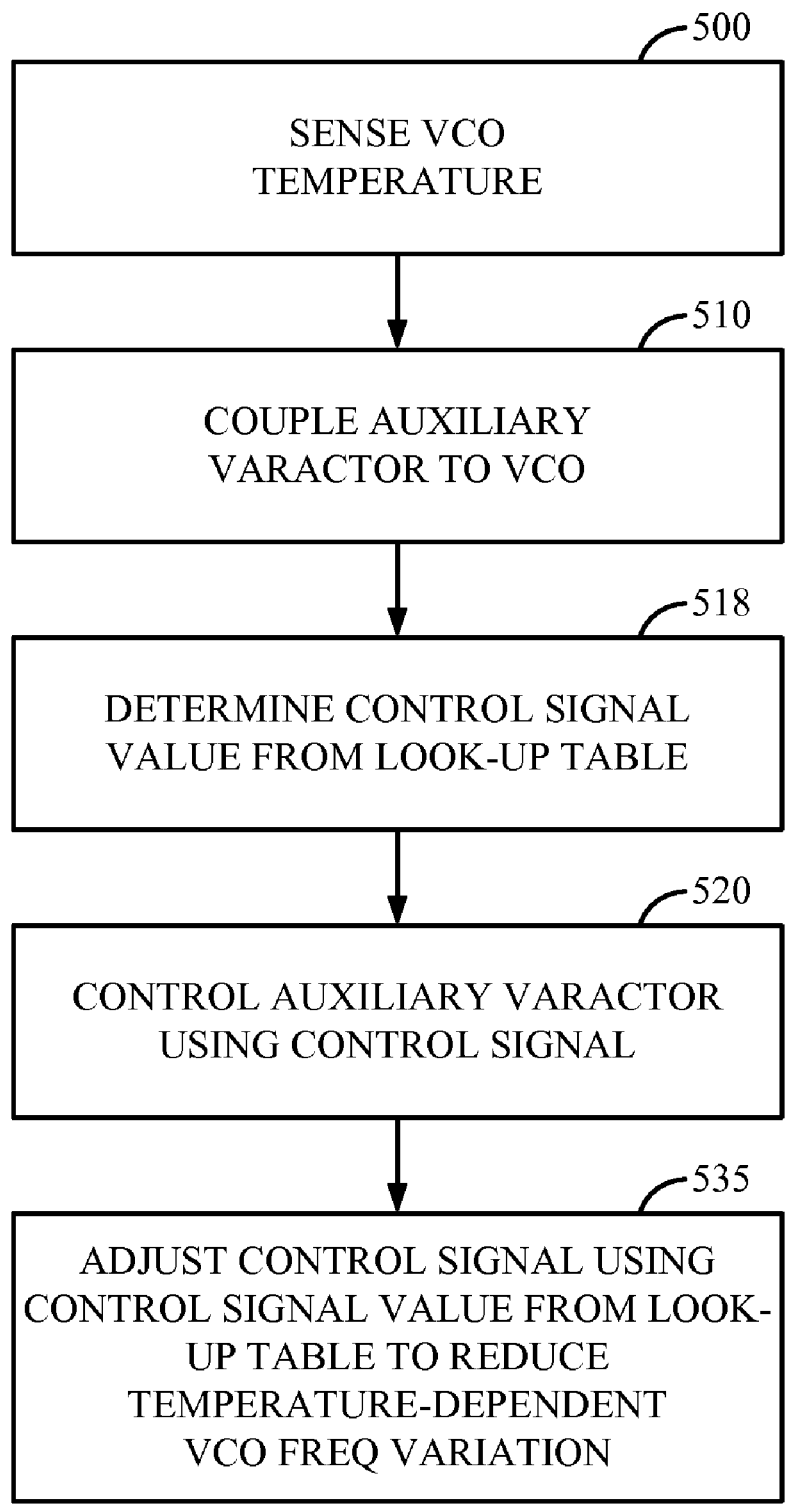
FIG. 6 depicts an alternative embodiment of a method according to the present disclosure.

FIG. 6 depicts an alternative embodiment of a method according to the present. In the process flow illustrated in FIG. 6, the steps of sensing a temperature of the VCO, coupling the auxiliary varactor to the VCO, controlling the auxiliary varactor using a control signal, and adjusting the control signal to reduce the temperature dependent VCO frequency variation, steps 500, 510, 520, and 530, may be performed in a similar manner as described above with reference to FIGS. 5A and 5B. However, in FIG. 6, the control signal used to control the auxiliary varactor may be determined by referring to a look-up table. For example, for a given sensed VCO temperature a corresponding control signal value may stored in a look-up table. By correlating the sensed temperature to a control signal value may be determined and applied to the auxiliary varactor, step 518.

The techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A method for adjusting the oscillation frequency of a voltage-controlled oscillator (VCO) in response to a temperature change in the VCO, the method comprising:
  sensing a temperature of the VCO, the VCO comprising an oscillator and an inductor-capacitor (LC) tank resonator, the LC tank resonator comprising at least one main varactor configured to be controlled by a first control signal, wherein the oscillation frequency of the VCO is configured to be coarsely tuned by the by the at least one main varactor;
  coupling an auxiliary varactor to the LC tank resonator of the VCO, the VCO being configured such that a change in the capacitance of the auxiliary varactor causing a change in the oscillation frequency of the VCO;
  controlling the capacitance of the auxiliary varactor using a second control signal generated by a temperature sensor/voltage generator unit, wherein the auxiliary varactor is configured to be coupled directly to the temperature sensor/voltage generator unit through an RC filter; and
  adjusting the second control signal based on the sensed temperature such that the variation in the VCO oscillation frequency due to VCO temperature change is reduced while maintaining a functional relationship between the second control signal and the sensed temperature,
  wherein the functional relationship between the second control signal and the sensed temperature is calculated as a product of an expected change in oscillation frequency of the VCO due to temperature and an expected change in capacitance of the auxiliary varactor due to the second control signal divided by a product of a change in sensed temperature and an expected change in the second control signal.

2. The method of claim 1, the coupling an auxiliary varactor to the LC tank resonator of the VCO comprising coupling the auxiliary varactor in series with the at least one main varactor of the LC tank resonator.

3. The method of claim 1, the coupling an auxiliary varactor to the LC tank resonator of the VCO comprising coupling the auxiliary varactor in parallel with the at least one main varactor of the LC tank resonator.

4. The method of claim 1, the VCO being an analog VCO.

5. The method of claim 3, the second control signal being a control voltage, the adjusting the control voltage comprising varying the control voltage proportionally to absolute temperature.

6. The method of claim 5, the varying the control voltage comprising providing a first current source generating a first current, the first current being proportional to absolute temperature.

7. The method of claim 6, further comprising increasing the first current by a first multiplicative factor.

8. The method of claim 6, the varying the control voltage further comprising providing a second current source coupled in series with the first current source, the second current source providing a second current constant over temperature, the difference between the first and second currents generating the control voltage.

9. The method of claim 8, the second current source being a bandgap current source.

10. The method of claim 8, further comprising increasing the current provided by the second current source by a second multiplicative factor.

11. The method of claim 8, further comprising low-pass filtering the difference between the first and second currents.

12. A voltage-controlled oscillator (VCO) having an oscillation frequency adjustable by at least one control voltage, a temperature change in the VCO causing a change in the oscillation frequency, the VCO comprising:
  an oscillator circuit coupled to an LC tank resonator, the LC tank resonator comprising an inductor and at least one main varactor configured to be controlled by a first control signal, wherein the oscillation frequency of the VCO is configured to be coarsely tuned by the by the at least one main varactor;
  a temperature sensor/voltage generator unit for generating a second control signal based on a sensed temperature of the VCO;
  an RC filter circuit; and
  an auxiliary varactor coupled to the LC tank resonator of the VCO and coupled directly to the temperature sensor/voltage generator unit through the RC filter circuit, wherein a change in the capacitance of the auxiliary varactor results in a change in the oscillation frequency of the VCO, the capacitance of the auxiliary varactor controlled by the second control signal, the second control signal adjusted based on a sensed temperature of the VCO such that the variation in VCO oscillation frequency due to VCO temperature change is reduced while maintaining a functional relationship between the second control signal and the sensed temperature,
  wherein the functional relationship between the second control signal and the sensed temperature is calculated as a product of an expected change in oscillation frequency of the VCO due to temperature and an expected change in capacitance of the auxiliary varactor due to the second control signal divided by a product of a change in sensed temperature and an expected change in the second control signal.

13. The VCO of claim 12, wherein the auxiliary varactor is coupled in series with the at least one main varactor of the LC tank resonator.

14. The VCO of claim 12, the VCO being an analog VCO.

15. The VCO of claim 12, wherein the auxiliary varactor is coupled in parallel with the at least one main varactor of the LC tank resonator.

16. The VCO of claim 15, the second control signal being a control voltage, the control voltage adjusted by varying the control voltage proportionally to absolute temperature.

17. The VCO of claim 16, further comprising a first current source generating a first current, the first current being proportional to absolute temperature, the control voltage generated by the first current.

18. The VCO of claim 17, further comprising a second current source coupled in series with the first current source, the second current source providing a second current constant over temperature, the difference between the first and second currents generating the control voltage.

19. The VCO of claim 18, the second current source being a bandgap current source.

20. The VCO of claim 18, at least one of the magnitudes of the first and second current sources adjustable by a multiplicative factor.

21. The VCO of claim 18, further comprising a low-pass filter coupled between the current sources and the auxiliary varactor.

22. A voltage-controlled oscillator (VCO) having an oscillation frequency adjustable in response to a temperature change in the VCO, the VCO comprising:
   an oscillator circuit;
   a LC tank resonator comprising at least one main varactor configured to be controlled by a first control signal, wherein the oscillation frequency of the VCO is configured to be coarsely tuned by the by the at least one main varactor;
   means for sensing a temperature of the VCO;
   means for coupling an auxiliary varactor to the LC tank resonator of the VCO, a change in the capacitance of the auxiliary varactor causing a change in the oscillation frequency of the VCO;
   means for generating a second control signal based on the sensed temperature of the VCO such that the variation in the VCO oscillation frequency due to a VCO temperature change is reduced;
   means for controlling the capacitance of the auxiliary varactor using the second control signal, wherein the auxiliary varactor is configured to be directly coupled to the means for generating the second control signal through an RC filter; and
   means for adjusting the second control signal based on the sensed temperature such that the variation in the VCO oscillation frequency due to VCO temperature change is reduced while maintaining a functional relationship between the second control signal and the sensed temperature, wherein the functional relationship between the second control signal and the sensed temperature is calculated as a product of an expected change in oscillation frequency of the VCO due to temperature and an expected change in capacitance of the auxiliary varactor due to the second control signal divided by a product of a change in sensed temperature and an expected change in the second control signal.

23. The VCO of claim 22, wherein the means for coupling an auxiliary varactor to the LC tank resonator of the VCO comprises means for coupling the auxiliary varactor in series with the at least one main varactor of the LC tank resonator.

24. The VCO of claim 22, the VCO being an analog VCO.

25. The VCO of claim 22, wherein the means for coupling an auxiliary varactor to the LC tank resonator of the VCO comprises means for coupling the auxiliary varactor in parallel with the at least one main varactor of the LC tank resonator.

26. The VCO of claim 25, the means for adjusting the control signal comprising means for varying a control voltage proportionally to absolute temperature.

* * * * *